(12) United States Patent
Nishibe et al.

(10) Patent No.: US 7,745,093 B2
(45) Date of Patent: *Jun. 29, 2010

(54) WATER SOLUBLE RESIN COMPOSITION AND METHOD FOR PATTERN FORMATION USING THE SAME

(75) Inventors: Takeshi Nishibe, Onomichi (JP); Sung Eun Hong, Kakegawa (JP); Yusuke Takano, Kakegawa (JP); Tetsuo Okayasu, Kakegawa (JP)

(73) Assignee: AZ Electronic Materials USA Corp.

( * ) Notice: Subject to any disclaimer, the term of this patent is extended or adjusted under 35 U.S.C. 154(b) by 420 days.

This patent is subject to a terminal disclaimer.

(21) Appl. No.: 11/547,707

(22) PCT Filed: Apr. 8, 2005

(86) PCT No.: PCT/JP2005/006961

§ 371 (c)(1),
(2), (4) Date: Oct. 5, 2006

(87) PCT Pub. No.: WO2005/098545

PCT Pub. Date: Oct. 20, 2005

(65) Prior Publication Data

US 2008/0193880 A1    Aug. 14, 2008

(30) Foreign Application Priority Data

Apr. 9, 2004    (JP) .............................. 2004-115872

(51) Int. Cl.
*G03F 7/40*    (2006.01)
*G03F 7/11*    (2006.01)

(52) U.S. Cl. ................. 430/270.1; 430/273.1; 430/324; 430/325; 430/326; 430/327; 430/328; 430/330; 430/905; 430/909; 430/914; 430/961; 430/964

(58) Field of Classification Search ....................... None
See application file for complete search history.

(56) References Cited

U.S. PATENT DOCUMENTS 6,555,607 B1    4/2003    Kanda et al. ................. 524/366

(Continued)

FOREIGN PATENT DOCUMENTS

JP    5-241348 A    9/1993

(Continued)

OTHER PUBLICATIONS

Machine-assisted English translation of JP2004-264373 provided by JPO.*

(Continued)

*Primary Examiner*—Sin J. Lee
(74) *Attorney, Agent, or Firm*—Sangya Jain

(57) ABSTRACT

In the present invention, in a water soluble resin composition for use in a method for pattern formation in which a covering layer is provided on a resist pattern formed of a radiation-sensitive resin composition capable of coping with ArF exposure to increase the width of the resist pattern and thus to realize effective formation of higher density trench or hole pattern, the size reduction level of the resist pattern layer can be further increased as compared with that in the prior art technique, and, in addition, the size reduction level dependency of the coarse-and-fine resist pattern can be reduced. A method for pattern formation using the water soluble resin composition is also provided. The water soluble resin composition which is usable for the method for pattern formation applicable to ArF excimer laser irradiation comprises a water soluble resin, an acid generating agent capable of generating an acid upon heating, a surfactant, a crosslinking agent, and a water-containing solvent.

11 Claims, 1 Drawing Sheet

U.S. PATENT DOCUMENTS

| | | | |
|---|---|---|---|
| 2003/0008968 A1 | 1/2003 | Sugeta et al. | 524/556 |
| 2003/0102285 A1 | 6/2003 | Nozaki et al. | 216/41 |
| 2004/0121259 A1 | 6/2004 | Kozawa et al. | 430/270.1 |
| 2006/0160015 A1 | 7/2006 | Takano et al. | 430/270.1 |

FOREIGN PATENT DOCUMENTS

| | | |
|---|---|---|
| JP | 6-250379 A | 9/1994 |
| JP | 10-73927 A | 3/1998 |
| JP | 2001-19860 A | 1/2001 |
| JP | 2001-228616 A | 8/2001 |
| JP | 2003-84460 A | 3/2003 |
| JP | 2004-46060 A | 2/2004 |
| JP | 2004-77951 A | 3/2004 |
| JP | 2004-264373 A | 9/2004 |

OTHER PUBLICATIONS

English Language Abstract of JP 5-24348 A, Sep. 21, 1993.
English Language Abstract of JP 6-230379 A, Sep. 9, 1994.
English Language Abstract of JP 10-73927 A, Mar. 17, 1998.
English Language Abstract of JP 2001-228616 A, Aug. 24, 2001.

* cited by examiner

WATER SOLUBLE RESIN COMPOSITION AND METHOD FOR PATTERN FORMATION USING THE SAME

This application is a United States National Stage Patent Application under 35 U.S.C. § 371 of International Patent Application No. PCT/JP2005/006961, filed Apr. 8, 2005, which claims priority to Japanese Patent Application No. 2004-115872, filed Apr. 9, 2004, the contents of both documents being hereby incorporated herein by reference.

BACKGROUND OF THE INVENTION

1. Field of the Invention

The present invention relates to a method for resist pattern formation in which, in the formation of a resist pattern in a semiconductor or the like manufacturing process or the like, a covering layer is formed using a water soluble resin composition on a resist pattern and the covering layer in its part located near the resist pattern is crosslinked to form a modified covering layer which is insoluble in a developing solution on the surface of the resist pattern and covers the resist pattern, thereby effectively reducing the isolation size or hole opening size of the resist pattern to those below the limiting resolution. The present invention also relates to a water soluble resin composition suitable for covering layer formation.

2. Background Art

In extensive fields including the manufacture of semiconductors such as LSIs, the preparation of flat panel displays (FPDs) such as liquid crystal display (LCD) panels, and the manufacture of circuit boards for thermal heads and the like, photolithography has hitherto been used for the formation of fine elements or microfabrication. In the photolithography, a positive- or negative-working radiation-sensitive resin composition (photoresist) is used for resist pattern formation. The positive- or negative-working photoresist is coated onto a substrate, and mask alignment is conducted, followed by exposure and development to form a resist pattern. The resist pattern thus formed is utilized, for example, as an etching resist and a resist for impurity ion implantation in the manufacture of semiconductor devices, FPDs, and circuit boards, and as a plating resist or the like in the manufacture of magnetic heads or the like.

In recent years, increased integration density in semiconductor devices or the like has led to an ever-increasing demand for a reduction in wiring or element isolation width required of the manufacturing process. To cope with this demand, various attempts have been made, for example, to increase the fineness of the resist pattern using shorter-wavelength light, to form a finer resist pattern using a phase shift reticle or the like, and to develop a novel resist and a novel process that can meet the demand. In the conventional photolithography utilizing exposure, however, difficulties are encountered in the formation of a resist pattern which is finer than a limit determined by the wavelength of light for exposure. On the other hand, apparatuses for exposure of short wavelength light and apparatuses using a phase shift reticle or the like are disadvantageously expensive. To solve the above problems, a method for pattern formation has been proposed which comprises the steps of:

(1) providing a conventional positive- or negative-working photoresist and forming a pattern by a conventional method for pattern formation, (2) providing an acid-crosslinkable covering layer on the formed resist pattern, (3) heating the covered resist pattern to diffuse an acid from the resist pattern to crosslink the covering layer in its part located near the resist pattern to form a modified covering layer insoluble in a developing solution on the surface of the resist pattern, and (4) conducting development to remove the covering layer in its part remaining uncured to cover the surface of the resist pattern with the covering layer having a given thickness, whereby the resist pattern width or the opening size in a line-and-space (L/S) pattern is reduced to effectively form a resist pattern which is finer than a resolution limit determined by the wavelength of light for exposure (see, for example, Japanese Patent Laid-Open Nos. 241348/1993, 250379/1994, 73927/1998, and 19860/2001). This method has drawn attention as an effective method, because the size of the space part in the resist pattern can be effectively reduced without large investment of equipment such as an exposure system for short wavelengths.

The present inventors have made an application (Japanese Patent Application No. 45599/2003) directed to a water soluble resin composition, a method for resist pattern formation using the same, and a method for testing a resist pattern. This water soluble resin composition comprises poly(vinyl pyrrolidone-co-vinyl acetate) or poly(vinyl pyrrolidone-co-vinylimidazole) as a water soluble resin, p-toluenesulfonic acid triethylamine salt as an acid generating agent, and acetylenic alcohol as a surfactant. A covering layer having a satisfactory thickness can be formed with a high dimension accuracy on a highly water repellent resist pattern formed of, for example, a radiation-sensitive resin composition capable of coping with an ArF exposure, whereby the resist pattern can be thickened to effectively reduce the pattern size to such a level that renders the resist pattern finer than the limiting resolution and, at the same time, a change in measured value upon electron beam irradiation in measuring SEM can be prevented.

The above conventional method in which a resist pattern is covered with a covering layer to reduce the width between resist patterns in an L/S pattern or reduce the opening size of contact patterns and thus to effectively form a resist pattern which is finer than the limiting resolution determined by wavelength of light for exposure has mainly be intended for a resist pattern formed of a KrF resist (a radiation-sensitive resin composition capable of coping with KrF) and has been effective for the KrF resist. On the other hand, an ArF excimer laser exposure process has recently been proposed for finer resist pattern formation, and this has led to a proposal of an ArF resist (a radiation-sensitive resin composition capable of coping with ArF exposure). Transparency to a 248 nm light source has been required of the conventional KrF resist. On the other hand, the ArF resist should be transparent to a 193 nm light source. This inevitably leads to predominant use of a polymer having a structure comprising a protective group introduced into an acrylic or methacrylic resin or the like. For example, a protective group having an alicyclic structure has been proposed as the protective group. Due to the nature of the structure, the hydrophobicity of the polymer per se is higher than that of the KrF resist. On the other hand, the composition for a covering layer is in many cases a composition composed mainly of a water soluble resin and water from the viewpoint of preventing dissolution of the resist film as the first layer. For this reason, in many cases, the conventional water soluble resin composition for a covering layer has no satisfactory coatability on a highly water repellent resist pattern such as the above ArF resist. This has sometimes made impossible to form a good covering layer or modified covering layer. Further, in some cases, the level of fineness of the resist pattern layer has been unsatisfactory, probably because the diffusion of an acid from the resist pattern is unsatisfactory. Furthermore, in the prior art technique, an increase in complexity of the resist pattern has raised a problem of a difference in size reduction level in a coarse-and-fine pattern of the resist pattern. In Japanese Patent Application No. 45599/2003, it was found that the effective size of a resist pattern formed of a radiation-sensitive resin composition capable of coping with ArF can be reduced to a value beyond the liming resolution. However, there is a demand for an improvement in pattern size reduction effect, that is, the formation of a thicker modified covering layer.

SUMMARY OF THE INVENTION

The present invention has been made with a view to solving the above problems of the prior art, and an object of the present invention is to provide a water soluble resin composition that can be applied onto a relatively highly water repellent ArF resist pattern formed by a conventional method to form a covering layer which is then heated for crosslink the covering layer in its part located near the resist pattern to form a modified covering layer insoluble in a developing solution on the surface of the resist pattern and thus to cover the resist pattern with the modified covering layer having a given thickness, that is, to render the resist pattern thick, whereby the isolation size or hole opening size of the resist pattern can be effectively reduced to such a level that renders the resist pattern finer than the limiting resolution with good dimension controllability, and to provide a method for pattern formation using the same.

According to one aspect of the present invention, there is provided a water soluble resin composition for use in a semiconductor manufacturing process, said semiconductor manufacturing process comprising the steps of: forming a covering layer on a resist pattern formed of a radiation-sensitive resin composition which can cope with ArF exposure; and heating the covered resist pattern to convert the covering layer in its part located near the resist pattern to a modified covering layer and thus to cover the resist pattern with the modified covering layer, whereby the effective size of the resist pattern after etching can be reduced, said water soluble resin composition comprising a water soluble resin, an acid generating agent capable of generating an acid upon heating, a crosslinking agent, and a water-containing solvent.

According to another aspect of the present invention, there is provided a method for pattern formation, comprising the steps of: coating the above water soluble resin composition onto a resist pattern formed of a radiation-sensitive resin composition capable of coping with ArF exposure to form a covering layer; heating the covering layer to crosslink the covering layer in its part with a predetermined thickness located near the resist pattern to form a modified covering layer insoluble in a developing solution; and developing the modified covering layer to form a pattern in which the surface of the resist pattern has been covered with the modified covering layer.

In the method for pattern formation according to the present invention, a trench pattern or a hole pattern can be effectively made finer by covering a formed resist pattern with a modified covering layer having a given thickness. When the composition according to the present invention is used, as compared with the conventional composition, the thickness of the modified covering layer can be significantly increased and, at the same time, a change in thickness of the modified covering layer caused by varying the form of the resist pattern, that is, a change in pattern size reduction level, can be reduced. The above effect can realize the production of a semiconductor integrated circuit or the like having an increasing tendency toward increased fineness and complexity at a high yield. Further, the water soluble resin composition according to the present invention advantageously has excellent coatability on the surface of a highly water repellent resist.

BEST MODE FOR CARRYING OUT THE INVENTION

Figure 1:
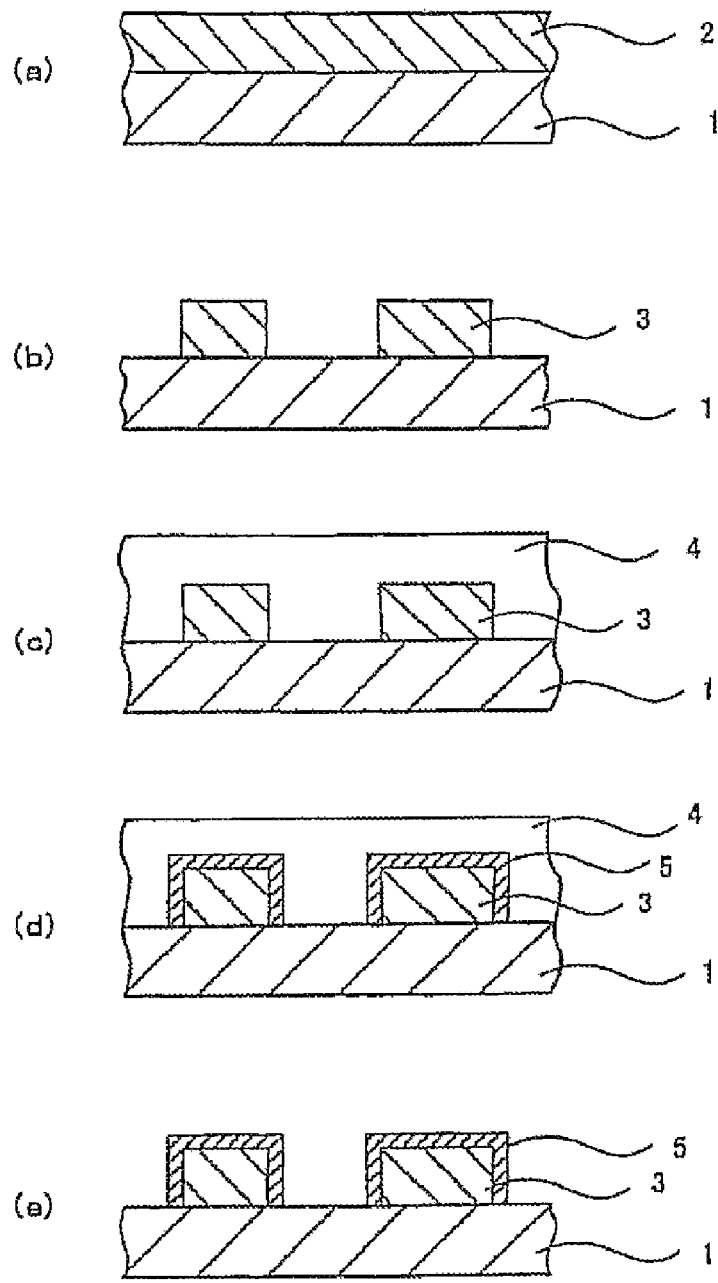
FIGS. 1A to 1E are conceptual diagrams illustrating the method for pattern formation according to the present invention.

The water soluble resin composition according to the present invention and the method for pattern formation using the water soluble resin will be described in more detail.

The water soluble resin composition according to the present invention will be first described. The water soluble resin composition according to the present invention comprises at least a water soluble resin, an acid generating agent capable of generating an acid upon heating, a crosslinking agent, and a water-containing solvent. The water soluble resin usable as a raw material of the water soluble resin composition according to the present invention may be any polymer which is publicly known and used in the art so far as the solubility of the polymer in water is not less than 0.1% by weight. Specific examples of water soluble resins include homopolymers of hydrophilic group-containing vinyl monomers and hydrophilic group-containing polycondensates. Examples of such resins include polyvinyl alcohols (including partial saponification products), polyacrylic acids, polymethacrylic acids, poly(2-hydroxy acrylate), poly(2-hydroxyethyl methacrylate), poly(4-hydroxybutyl acrylate), poly(4-hydroxybutyl methacrylate), poly(glycosyloxyethyl methacrylate), polyvinyl methyl ethers, polyvinyl pyrrolidones, polyethylene glycols, polyvinyl acetals (including partial acetalization products), polyethyleneimines, polyethylene oxides, styrene-maleic anhydride copolymers, polyvinylamines, polyallylamines, oxazoline group-containing water soluble resins, water soluble melamine resins, water soluble urea resins, alkyd resins, sulfonamides, or salts of these resins. They may be used either alone or in a combination of two or more. Among these resins, compolymers represented by formula (I) are particularly preferred. The polymer may be either a random polymer or a block polymer. However, the random polymer is particularly preferred.

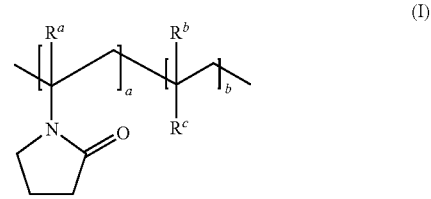

(I)

wherein $R^a$ and $R^b$ each independently represents a hydrogen atom or a methyl group; $R^cC$ represents —OH, —COOH, —OCOR$^d$, where $R^d$ represents an alkyl group, or

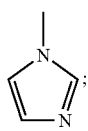

and a and b each independently are 10 to 100,000.

Any molecular weight of the water soluble resin may be selected so far as the effect of the present invention is not sacrificed. From the viewpoint of satisfactory coatability for providing a homogeneous coating film and temporal stability of the coating film, however, the molecular weight is preferably not less than 1000, more preferably not less than 3000. The molecular weight is preferably not more than 1,000,000, more preferably not more than 200,000, from the viewpoints of preventing cobwebbing at the time of coating, keeping good filter permeability, and forming an even coating film using a small dropping amount.

The acid generating agent according to the present invention is not particularly limited so far as it generates an acid upon heating and is soluble in water. However, an organic acid amine salt which generates an acid upon heating at 70 to 200° C. is particularly suitable. In particular, an acid generating agent having a structure of a combination of an acid with a base represented by the following general formula is preferred.

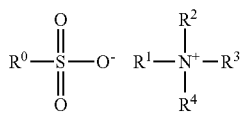

wherein
$R^0$ represents $-C_nH_{2n+1-m}F_m$ where n is 1 to 20 and m is 0 to 2n+1,

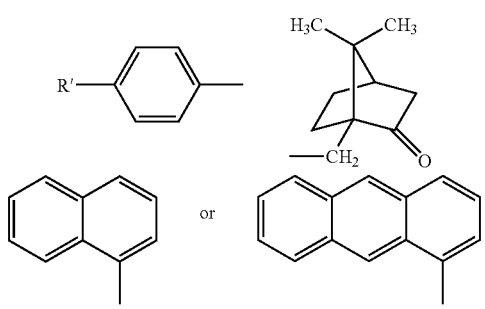

where R' is $-(CH_2)_xCH_3$, $-OH$, or $-COOH$ in which x is 0 to 20; and $R^1$, $R^2$, $R^3$, and $R^4$ each independently represent $-H$, $C_pH_{2p+1}$, or $-C_pH_{2p}OH$ where p is 1 to 10.

Specific examples of acids usable herein include alkylsulfonic acids, fluorinated alkylsulfonic acids, or sulfonic acids having a benzene, naphthalene, or anthracene aromatic skeleton. Specific examples of preferred amines include alkylamines and alkanolamines. More specific examples of acids include p-toluenesulfonic acid, perfluorobutanesulfonic acid, perfluorooctanesulfonic acid, (±)camphor-10-sulfonic acid, and dodecylbenzenesulfonic acid. Triethylamine, tripropylamine, and dimethylaminoethanol are suitable as the amine. These acid generating agents may be used either solely or as a mixture of two or more.

In the present invention, the crosslinking agent is not particularly limited so far as it is soluble in water. Preferred are alkylated urea water soluble crosslinking agents, oxazoline group-containing polymers, and polyamines. The following alkylated urea water soluble crosslinking agents are particularly preferred.

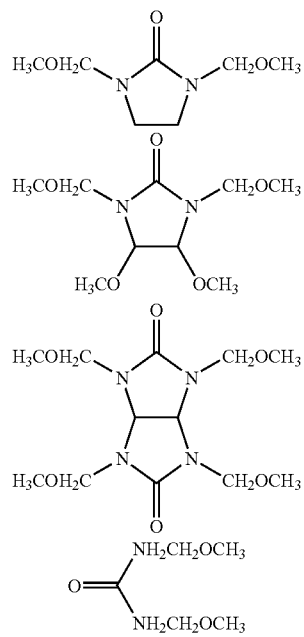

These crosslinking agents may be used either solely or as a mixture of two or more.

The water soluble resin composition according to the present invention may further comprise a surfactant. Surfactants include acetylenic alcohols, acetylenic glycols, polyethoxylates of acetylenic alcohols, and polyethoxylates of acetylenic glycols. Acetylenic alcohols and acetylenic glycols include, for example, 3-methyl-1-butyn-3-ol, 3-methyl-1-pentyn-3-ol, 3,6-dimethyl-4-octyn-3,6-diol, 2,4,7,9-tetramethyl-5-decyn-4,7-diol, 3,5-dimethyl-1-hexyn-3-ol, 2,5-dimethyl-3-hexyn-2,5-diol, and 2,5-dimethyl-2,5-hexanediol. These surfactants may be used either solely or as a mixture of two or more. The amount of the surfactant used is preferably 50 to 2000 ppm, more preferably 100 to 1000 ppm, based on the water soluble resin composition according to the present invention.

The water soluble resin composition according to the present invention comprises a water-containing solvent as a solvent. This solvent may be water. When water is used as the solvent, preferably, organic impurities and metal ions have been removed from water by distillation, ion exchange treatment, filter treatment, various adsorption treatments or the like.

Water soluble organic solvents may be used together with water. The use of such organic solvents can improve coating properties and the like. The water soluble organic solvent is not particularly limited so far as the solubility thereof in water is not less than 0.1% by weight. Such water soluble organic solvents include, for example, alcohols such as methyl alcohol, ethyl alcohol, and isopropyl alcohol, ketones such as acetone, methyl ethyl ketone, and 2-heptanone cyclohexanone, esters such as methyl acetate and ethyl acetate, ethylene glycol monoalkyl ethers such as ethylene glycol monomethyl ether and ethylene glycol monoethyl ether, ethylene glycol monoalkyl ether acetates such as ethylene glycol monomethyl ether acetate and ethylene glycol monoethyl ether acetate, propylene glycol monoalkyl ethers such as propylene glycol monomethyl ether and propylene glycol monoethyl ether, propylene glycol monoalkyl ether acetates such as propylene glycol monomethyl ether acetate and propylene glycol monoethyl ether acetate, lactates such as methyl lactate and ethyl lactate, aromatic hydrocarbons such as toluene and xylene, amides such as N,N-dimethylacetamide and N-methylpyrrolidone, and lactones such as γ-butyrolactone. Preferred are lower alcohols such as methyl alcohol, ethyl alcohol, and isopropyl alcohol. These solvents may be used either solely or as a mixture of two or more.

The method for pattern formation according to the present invention will be described with reference to the accompanying drawings by taking the formation of a resist pattern using an ArF resist as an example.

FIGS. 1A to 1E are conceptual diagrams illustrating the method for forming a modified covering layer insoluble in a developing solution using the water soluble resin composition according to the present invention on the surface of an ArF resist pattern. Each diagram is a typical cross-sectional view in which numeral 1 designates a substrate, numeral 2 a photoresist layer, numeral 3 a resist pattern, numeral 4 a covering layer, and numeral 5 a modified covering layer.

As shown in FIG. 1A, an ArF resist (for example, a positive-working chemical amplification resist) is first coated onto a substrate 1 to be treated such as a semiconductor substrate to form a photoresist layer 2. The photoresist layer 2 is then exposed through a photomask (not shown) with an exposure system equipped with an ArF excimer laser beam source, followed by development to form a positive resist pattern 3 (FIG. 1B). As shown in FIG. 1C, the water soluble resin composition according to the present invention is then coated so as to cover the resist pattern 3 to form a covering layer 4. Thereafter, the resist pattern 3 and the covering layer 4 are heated. Since the water soluble resin composition according to the present invention contains an acid generating agent capable of generating an acid upon heating, the acid generated from the acid generating agent upon heating induces crosslinking of the covering layer. In this case, the degree of crosslinking of the covering layer 4 in its part located near the resist pattern 3 is higher than that in the other part, whereby a modified covering layer 5 insoluble in a developing solution which will be described later is formed. On the other hand, in the other part of the covering layer 4, the crosslinking or curing reaction does not proceed to a large extent, and, consequently, the covering layer in its part other than the modified covering layer can remain soluble in the developing solution (FIG. 1D). The reason why the degree of crosslinking in the covering layer in its part located near the resist pattern 3 is higher than that in the other part of the covering layer has not been elucidated yet. However, while there is no intention of being bound by any particular theory, a part of the reason for this is believed to be such that, upon heating, intermixing occurs between the surface part of the resist pattern 3 and the covering layer 4 in its part located near the resist pattern. The covering layer 4 in which the modified covering layer 5 insoluble in the developing solution has been formed is developed to form a pattern in which a modified covering layer 5 is provided on the surface of the resist pattern 3 (FIG. 1E).

As described above, the formation of the modified covering layer 5 on the surface (upper surface and side surface) of the resist pattern 3 reduces the width of the resist pattern and can effectively reduce the spacing size or the hole opening size of the resist pattern to those below the limiting resolution.

The radiation-sensitive resin composition usable in the formation of the resist pattern 3 may be any radiation-sensitive resin composition which is publicly known and used in the art. Radiation-sensitive resin compositions include, for example, positive-working resists containing alkali soluble resins, such as novolak resins, hydroxystyrene resins, or acrylic resins, and quinonediazide compounds, and chemical amplification positive-working or negative-working resists that, upon exposure to light, generate an acid of which the catalytic action is utilized to form a resist pattern. Preferred are chemical amplification positive-working resists that, upon exposure to light, generate an acid of which the catalytic action is utilized to form a resist pattern. In the resist pattern formed from a conventional highly water repellent resist, for example, an ArF resist, difficulties are encountered in the formation of a modified covering layer having satisfactory thickness on a resist pattern by a method in which a water soluble resin covering layer crosslinkable by an acid is formed on a resist pattern and the covering layer is crosslinked through diffusion of the acid from the resist pattern. The composition according to the present invention advantageously has satisfactory coatability on a resist which is relatively highly water repellent as the radiation-sensitive resin composition, for example, an ArF resist. A large number of ArF resists have already been proposed and further are commercially available. Any of these publicly known and used ArF resists may be used. The resist pattern may be formed using the radiation-sensitive resin composition by any conventional method including coating methods, exposure methods, baking methods, development methods, developers, and rinsing methods.

In the method for pattern formation according to the present invention, the water soluble resin composition according to the present invention for constituting the covering layer may be coated, for example, by any proper method which has hitherto been used in coating the radiation-sensitive resin composition, for example, by spin coating, spray coating, dip coating, or roller coating. The coated covering layer is optionally prebaked to form a covering layer 4. The covering layer is heat treated, for example, under conditions of temperature about 70 to 200° C., heating time period about 60 to 120 sec, preferably about 50 to 80 sec. The temperature at which intermixing between the resist pattern and the covering layer takes place is preferred. The thickness of the covering layer may be properly regulated, for example, by the heat treatment temperature and time and the radiation-sensitive resin composition and water soluble resin composition used. Therefore, these various conditions may be set depending upon the level of the width of resist pattern to be widen. The thickness of the covering layer, however, is generally 0.01 to 100 μm.

Developers usable for the modified covering layer for leaving the modified covering layer 5 formed by heating while removing the covering layer in its other part include water, mixed solutions composed of water and water soluble organic solvents, and aqueous solutions of alkalis such as TMAH (tetramethyl ammonium hydroxide).

The following Examples further illustrate the present invention but are not intended to limit it.

EXAMPLE 1

Preparation of Water Soluble Resin Composition 18.7 g of an aqueous water soluble resin solution (30 wt %) containing polyvinyl pyrrolidone-co-polyvinyl imidazole (molecular weight 75000, copolymer composition vinyl pyrrolidone:vinyl imidazole=0.76:1) as a water soluble resin was dissolved in 79.2 liters of water at room temperature to prepare a solution. 0.65 g of an aqueous p-toluenesulfonic acid triethylamine salt solution (70 wt %) was added to the solution. Subsequently, 1.52 g of 1,3-dimethoxymethyl-4,5-dimethoxyimidazoline (tradename: Nikalac MX-280, manufactured by Sanwa Chemical Co.) as a crosslinking agent and 0.05 g of polyoxyethylene alkyl ether (tradename: Pionion D1420, manufactured by Takemoto Oil & Fat Co., Ltd.) were added thereto, and the mixture was adjusted to have the following weight ratio, followed by thorough stirring for dissolution. The solution was then filtered through a 0.2-μm filter to prepare a water soluble resin composition A.

TABLE 1

| Composition A | Weight ratio |
| --- | --- |
| Polyvinyl pyrrolidone-co-polyvinyl imidazole | 5.6 |
| p-Toluenesulfonic acid triethylamine salt | 0.46 |
| 1,3-Dimethoxymethyl-4,5-dimethoxyimidazoline | 1.52 |
| Polyoxyethylene alkyl ether | 0.05 |
| Water | 92.4 |

EXAMPLE 2

Preparation of Water Soluble Resin Composition

The procedure of Example 1 was repeated, except that the crosslinking agent was changed to urea-formaldehyde-methyl alcohol polycondensate (tradename: Nikalac MX-290, manufactured by Sanwa Chemical Co.) and the mixing ratio of the ingredients was as follows. The mixture thus obtained was thoroughly stirred for dissolution, and the solution was then filtered through a 0.2-μm filter to prepare a water soluble resin composition B.

TABLE 2

| Composition B | Weight ratio |
| --- | --- |
| Polyvinyl pyrrolidone-co-polyvinyl imidazole | 7.0 |
| p-Toluenesulfonic acid triethylamine salt | 0.52 |
| Urea-formaldehyde-methyl alcohol polycondensate | 1.52 |
| Polyoxyethylene alkyl ether | 0.05 |
| Water | 92.4 |

EXAMPLE 3

Preparation of Water Soluble Resin Composition

The procedure of Example 1 was repeated, except that the crosslinking agent was changed to N,N'-dimethoxymethyltetrahydro-2-pyrimidone (tradename: Nikalac N1951, manufactured by Sanwa Chemical Co.) and the mixing ratio of the ingredients was as follows. The mixture thus obtained was thoroughly stirred for dissolution, and the solution was then filtered through a 0.2-μm filter to prepare a water soluble resin composition C.

TABLE 3

| Composition C | Weight ratio |
| --- | --- |
| Polyvinyl pyrrolidone-co-polyvinyl imidazole | 7.0 |
| p-Toluenesulfonic acid triethylamine salt | 0.52 |
| (N,N'-Dimethoxymethyltetrahydro-2-pyrimidone) | 1.52 |
| Polyoxyethylene alkyl ether | 0.05 |
| Water | 92.4 |

EXAMPLE 4

Preparation of Water Soluble Resin Composition

The procedure of Example 1 was repeated, except that the water soluble resin was changed to polyvinyl pyrrolidone-co-polyvinyl imidazole (molecular weight 75000, copolymer composition vinyl pyrrolidone:vinyl imidazole=2.24:1) and the mixing ratio of the ingredients was as follows. The mixture thus obtained was thoroughly stirred for dissolution, and the solution was then filtered through a 0.2-μm filter to prepare a water soluble resin composition D.

TABLE 4

| Composition D | Weight ratio |
| --- | --- |
| Polyvinyl pyrrolidone-co-polyvinyl imidazole | 5.60 |
| p-Toluenesulfonic acid triethylamine salt | 0.46 |
| 1,3-Dimethoxymethyl-4,5-dimethoxyimidazoline | 1.52 |
| Polyoxyethylene alkyl ether | 0.05 |
| Water | 92.45 |

EXAMPLE 5

Preparation of Water Soluble Resin Composition

The procedure of Example 1 was repeated, except that the water soluble resin was changed to polyvinyl pyrrolidone-co-polyvinyl imidazole (molecular weight 240000, copolymer composition vinyl pyrrolidone:vinyl imidazole=0.76:1) and the mixing ratio of the ingredients was as follows. The mixture thus obtained was thoroughly stirred for dissolution, and the solution was then filtered through a 0.2-μm filter to prepare a water soluble resin composition E.

TABLE 5

| Composition E | Weight ratio |
| --- | --- |
| Polyvinyl pyrrolidone-co-polyvinyl imidazole | 5.6 |
| p-Toluenesulfonic acid triethylamine salt | 0.46 |
| 1,3-Dimethoxymethyl-4,5-dimethoxyimidazoline | 1.52 |
| Polyoxyethylene alkyl ether | 0.05 |
| Water | 92.4 |

COMPARATIVE EXAMPLE 1

For comparison, a water soluble resin composition F for a covering layer (tradename: AZ Exp.R600, manufactured by Clariant (Japan) K.K.) was provided. The water soluble resin composition F had the following composition.

TABLE 6

| Composition F | Weight ratio |
|---|---|
| Polyvinyl pyrrolidone-co-polyvinyl imidazole*[1] | 7.1 |
| p-Toluenesulfonic acid triethylamine salt | 0.47 |
| Polyoxyethylene (4) acetylenic glycol ether*[2] | 0.05 |
| Water | 92.4 |

*[1]Molecular weight 75000, copolymer composition vinyl pyrrolidone:vinyl imidazole = 1:0.76
*[2]Acetylenol EL (tradename), manufactured by Kawaken Fine Chemicals Co., Ltd.

Formation of Contact Hole Pattern

An underlying antireflection film AZ ArF-1C5D (tradename: manufactured by Clariant Corp.) was coated onto an 8 in. silicon wafer by a spin coater (MK-8) manufactured by Tokyo Electron Limited. The coated silicon wafer was prebaked on a hot plate at 200° C. for 60 sec. Thereafter, a positive-working photosensitive resin composition AZ AX1050HS (tradename: manufactured by Clariant Corp.) was coated to provide an about 0.022 μm-thick resist film which was then prebaked on a hot plate at 115° C. for 60 sec. An exposure system with an exposure wavelength of ArF radiation (193 nm) (NSR-S306C ArF Scanner, manufactured by NIKON CORPORATION) was then provided, and exposure was carried out using a pattern having various contact holes, followed by post exposure baking (PEB) on a hot plate at 110° C. for 60 sec. Thereafter, spray paddle development was carried out with an alkaline developing solution (AZ 300 MIF developer (tradename), 2.38 wt % aqueous tetramethyl ammonium hydroxide solution) manufactured by Clariant (Japan) K.K. at 23° C. for one min to form a positive-working resist pattern with a hole diameter of 130 nmφ and pitch sizes 260 nm and 780 nm.

Evaluation of Hole Diameter Reduction Level

The water soluble resins A to F were coated on the hole pattern formed above by a spin coater (MK-8) manufactured by Tokyo Electron Limited to provide an about 0.30 μm-thick covering layer, and the patterns were subjected to mixing baking on a hot plate at 160° C. for 90 sec. Thereafter, development was carried out with pure water at 23° C. for one min to separate the uncured layer. Thus, resist patterns were formed in which a modified covering layer was provided on the contact hole pattern. For the evaluation of hole diameter reduction level, the hole diameter of the hole pattern was measured before and after the modified covering layer formation with a high-precision appearance dimension evaluation apparatus (S-9200) manufactured by Hitachi, Ltd. to determine the change in the measured hole diameter. The results were as shown in Table 7.

TABLE 7

| Water soluble resin composition | Hole diameter reduction level* | | Rate of change in hole diameter reduction level |
|---|---|---|---|
| | Pitch size 260 nm | Pitch size 780 nm | |
| Ex. 1 | A | 26.9 | 31.3 | 14 |
| Ex. 2 | B | 47.3 | 60.0 | 21 |
| Ex. 3 | C | 32.7 | 51.3 | 36 |
| Ex. 4 | D | 34.1 | 43.6 | 22 |
| Ex. 5 | E | 44.3 | 44.6 | 0.7 |
| Comp. Ex. 1 | F | 16.6 | 23.5 | 29 |

*Hole diameter reduction level in the formation of positive-working resist pattern with hole diameter of 130 nmφ.

CRITERIA OF EVALUATION

The hole diameter reduction level and the rate of change in hole diameter reduction level were determined according to the following equations.

(Hole diameter reduction level)(nm)=(size before insolubilized layer formation)−(size after insolubilized layer formation)

(Rate of change in hole diameter reduction level)= [(hole diameter reduction level in positive-working resist pattern with hole diameter of 130 nm+and pitch size of 780 nm)−(hole diameter reduction level in positive-working resist pattern with hole diameter of 130 nmφ and pitch size of 260 nm)]/(hole diameter reduction level in positive-working resist pattern with hole diameter of 130 nmφ and pitch size of 780 nm)×100

The results of the measurement of the hole diameter reduction level in Table 7 show that the use of the water soluble resin composition according to the present invention can significantly reduce the hole diameter of the contact hole pattern as compared with the use of the conventional composition (Comparative Example 1). Further, the results of the determination of the rate of change in hole diameter reduction level show that the change in hole diameter reduction level upon a change in a pattern pitch size is comparable to or better than that in the conventional composition. In particular, the results of Example 5 show that the hole diameter becomes significantly small and, at the same time, there is substantially no variation in hole diameter even upon a change in pattern pitch.

The invention claimed is:

1. A water soluble resin composition for use in a semiconductor manufacturing process, where said water soluble resin composition comprises a water soluble resin, an acid generating agent capable of generating an acid upon heating, a crosslinking agent, and a water-containing solvent, wherein said acid generating agent is represented by formula

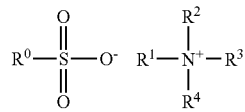

wherein
$R^0$ represents —$C_nH_{2n+1-m}F_m$ where n is 1 to 20 and m is 0 to 2n+1,

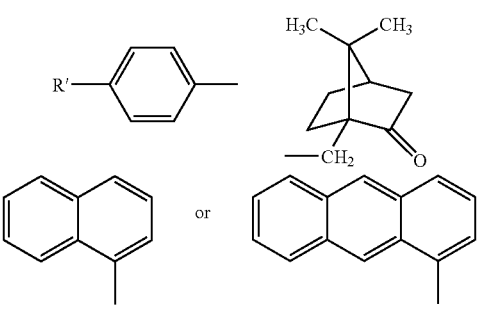

where R' is —$(CH_2)_xCH_3$, —OH, or —COOH in which x is 0 to 20; and
$R^1$, $R^2$, $R^3$, and $R^4$ each independently represent —H, $C_pH_{2p+1}$, or —$C_pH_{2p}OH$ where p is 1 to 10.

2. The water soluble resin composition according to claim 1, wherein said water soluble resin comprises a copolymer of N-vinylpyrrolidone with vinylimidazole.

3. The water soluble resin composition according to claim 1, which further comprises at least one surfactant selected from the group consisting of acetylenic alcohols, acetylenic glycols, polyethoxylates of acetylenic alcohols, and polyethoxylates of acetylenic glycols.

4. The water soluble resin composition according to claim 1, wherein said water-containing solvent consists of water alone, or a mixture of water with a water soluble organic solvent.

5. The water soluble resin composition according to claim 1, wherein said crosslinking agent is an alkylated urea, oxazoline group-containing polymer, or polyamines.

6. The water soluble resin composition according to claim 1, which comprises, based on 100 parts by weight of the water soluble resin composition, 1 to 30 parts by weight of the water soluble resin, 0.01 to 10 parts by weight of the acid generating agent.

7. A method for pattern formation, comprising the steps of: coating the water soluble resin composition according claim 1 onto a resist pattern formed of a radiation-sensitive resin composition capable of coping with ArF exposure to form a covering layer; heating the covering layer to crosslink the covering layer in its part with a predetermined thickness located near the resist pattern to form a modified covering layer insoluble in a developing solution; and developing the modified covering layer to form a pattern in which the surface of the resist pattern has been covered with the modified covering layer.

8. The method of claim 7, where the modified covering layer has a film thickness in the range of 0.01 to 100 μm.

9. A pattern covered with a modified covering layer, which is composed of resist pattern formed of a radiation-sensitive resin composition capable of coping with ArF exposure and the modified covering layer formed on the surface of the resist pattern, wherein the modifiedcovering layer is formed by coating the water soluble resin composition according to claim 1 onto the resist pattern to form a covering layer, by heating the covering layer located near the resist pattern to crosslink in its part with a predetermined thickness to form the modified covering layer insoluble in a developing solution and by developing the modified covering layer to form the pattern.

10. The pattern of claim 9, where the modified covering layer has a film thickness in the range of 0.01 to 100 μm.

11. The composition of claim 1, where the water soluble resin has the structure,

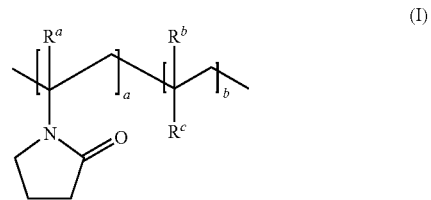

(I)

wherein $R^a$ and $R^b$ each independently represents a hydrogen atom or a methyl group; $R^c$ represents —OH, —COOH, —OCOR$^d$, where $R^d$ represents an alkyl group, or

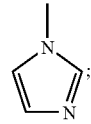

and a and b each independently are 10 to 100,000.

* * * * *